(12) United States Patent
Davis et al.

(10) Patent No.: US 6,590,285 B1
(45) Date of Patent: Jul. 8, 2003

(54) METHOD AND COMPOSITION FOR MOUNTING AN ELECTRONIC COMPONENT AND DEVICE FORMED THEREWITH

(75) Inventors: John G. Davis, Charlotte, NC (US); Joseph D. Poole, Troutman, NC (US); Kris A. Slesinger, Charlotte, NC (US); Michael C. Weller, Harrisburg, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/723,706

(22) Filed: Nov. 28, 2000

Related U.S. Application Data

(62) Division of application No. 09/067,940, filed on Apr. 28, 1998.

(51) Int. Cl.[7] .......................... H01L 23/48; H01L 23/52
(52) U.S. Cl. ................. 257/735; 257/737; 257/778; 257/783
(58) Field of Search .................. 156/64, 152, 247, 156/249, 299; 438/106, 107, 108, 119, 14, 17; 29/832, 834, 842, 593, 739, 740, 741; 257/735, 737, 738, 778, 783

(56) References Cited

U.S. PATENT DOCUMENTS

| | | | |
|---|---|---|---|
| 3,795,047 A | | 3/1974 | Abolafia et al. |
| 3,955,024 A | | 5/1976 | Goldman et al. |
| 4,157,932 A | | 6/1979 | Hirata |
| 4,242,157 A | | 12/1980 | Gehle |
| 4,269,759 A | * | 5/1981 | Edelman .................... 428/367 |
| 4,442,966 A | | 4/1984 | Jourdain et al. |
| 4,483,889 A | * | 11/1984 | Andersson ............... 162/168.2 |
| 4,578,215 A | | 3/1986 | Bradley |
| 4,661,192 A | | 4/1987 | McShane |
| 4,811,081 A | * | 3/1989 | Lyden ......................... 357/80 |
| 4,818,823 A | | 4/1989 | Bradley |
| 5,261,156 A | * | 11/1993 | Mase et al. ................... 156/64 |
| 5,296,063 A | | 3/1994 | Yamamura et al. |
| 5,372,750 A | | 12/1994 | Thoma |
| 5,463,190 A | | 10/1995 | Carson et al. |
| 5,611,884 A | * | 3/1997 | Bearinger et al. .......... 156/325 |
| 5,842,273 A | * | 12/1998 | Schar .......................... 29/830 |
| 5,879,965 A | * | 3/1999 | Jiang et al. ................. 438/111 |

* cited by examiner

Primary Examiner—Michael W. Ball
Assistant Examiner—John T. Haran
(74) Attorney, Agent, or Firm—Schmeiser, Olsen & Watts; Lawrence R. Fraley

(57) ABSTRACT

A method of mounting a component on a substrate includes applying a conductive adhesive on a contact pad joined to a substrate, aligning a component with the substrate such that at least one lead of the component is juxtaposed with the conductive adhesive, performing a partial cure of the conductive adhesive, testing performance of the component, and performing a full cure of the conductive adhesive. Another method includes the additional steps of applying a tacky film to the substrate and juxtaposing the component with the tacky film. When the testing in either embodiment shows a defective or misaligned component, the component may be replaced or repositioned by cold separation of the at least one component lead from the partially cured conductive adhesive. Optionally, additional conductive adhesive may be applied, when needed, before replacement or repositioning of a component. A composition for mounting a component on a circuit board includes a conductive adhesive screened on a contact pad, the conductive adhesive being partially cured, wherein the composition allows cold separation of the component from the substrate and may be fully cured by heat exposure. An apparatus is also provided including a component, a substrate, and a means for temporarily mounting and electrically connecting the component on the substrate.

16 Claims, 3 Drawing Sheets

METHOD AND COMPOSITION FOR MOUNTING AN ELECTRONIC COMPONENT AND DEVICE FORMED THEREWITH

This application is a divisional of application Ser. No. 09/067,940 filed on Apr. 28, 1998.

BACKGROUND OF THE INVENTION

1. Technical Field

This invention relates to the field of mounting an electronic component on a substrate, particularly on circuit boards. More specifically the invention relates to a method and composition for mounting an electronic component on a substrate and the device formed by using such a method and composition.

2. Background Art

An increasing need exists in the electronics and/or computer industry to provide electronic packages of components and substrates, wherein multiple components are joined to a single substrate, such as a circuit board, particularly a printed circuit board (PCB). In fabricating such packages, the components and substrate are typically tested individually prior to assembly. However, once the package is fully assembled, defective devices may still be discovered in subsequent testing of the overall package due to problems at the system level, that is, problems only apparent when certain components and the substrate operate together in their respective systems. Also, problems may become apparent due to improper alignment or orientation of a component on the substrate. In either case, the most common remedy of the defect is rework, that is, removal and replacement of a component with a new component or repositioning of the component.

The rework process is time consuming and can introduce new defects into the package, other components, and/or the substrate. Often, solder paste is used to attach components to a substrate. The soldered connections that result from the soldering process are conductive and durable, as desired, however, they are also difficult to rework. A component attached with solder is generally removed by using a soldering iron or hot gas removal tools. The goal is to remove selectively and reattach only the desired components without effecting the delicate components that neighbor the desired components on the substrate. Nevertheless, whenever a soldering iron, hot gas tools, or other heated tools are used it is extremely difficult to avoid exposing neighboring components to the heat as well. The heat exposure may damage a component, the substrate, or a solder connection or otherwise introduce another defect into the package. Accordingly, a removal process that does not require heat is needed.

In some packages, adhesives are used to attach components to the substrate. The adhesives are often either conductive or nonconductive epoxies, wherein conductive epoxies are used in a similar fashion to solder paste. That is, the conductive epoxy is applied to the substrate, the electrical leads of a component are juxtaposed with the epoxy, and then heat is usually required to cure the epoxy and create a sufficiently strong mechanical bond and sufficiently reliable electrical connection. When solder paste is used, a similar process is followed except that the heat causes the solder paste to flow into a molten state and harden after removal of the heat. The ability to later reflow the solder allows reworking of soldered components, however, existing technology does not provide a process for reworking cured conductive epoxy. Accordingly, even if subsequent testing showed that an epoxied package was defective, current practices would not allow for the replacement or repositioning of selected components. For this reason, the inability to rework conductive epoxy is presently considered a disadvantage of such technology. Accordingly, an attachment process that also allows reworking is needed.

Attempts have been made to remedy the problems discussed above, however, they have met only limited success. Adhesive tape and conductive resin have been used for components with peripheral leads, wherein the leads electrically connect to contact pads on the substrate surrounding the perimeter of the component. The adhesive tape is placed between the component and the substrate to provide a mechanical connection and the conductive resin is placed on the contact pads to provide an electrical connection with the peripheral leads. The conductive resin does not bond the leads to the pads, it simply provides a conduction path, thus, the component may be replaced or repositioned by removing it from the adhesive tape. Accordingly, the removal process does not require heat and the attachment process allows reworking, but the electrical connection has proven unreliable. Because the conductive resin does not provide a mechanical bond of the leads to the contact pads, the electrical connection may be easily compromised. The adhesive tape might be sufficient to bond the component to the substrate, but it is not sufficient to keep the leads electrically connected to the contact pads. Accordingly, an attachment process that provides a durable electrical connection is also needed.

Notably, the tape and resin process described above is applicable to a limited number of component types. For example, it would be impractical to use the process with a component having for its leads an array of conductive bumps between the component and the substrate, providing both an electrical and a mechanical connection. The difficulty of applying adhesive tape amongst an array of contact pads on a substrate is typically sufficient to discourage use of the tape and resin process. Accordingly, an attachment process applicable to a variety of components is also needed.

Thus, it can be seen from the above discussion that it would be an improvement in the art to provide a method for forming durable connections between a variety of components and substrates, wherein the connections do not require heat for reworking. In other words, the ability to rework is needed while providing durable and reliable connections, wherein the rework has little impact on the substrate and neighboring components and connections.

DISCLOSURE OF INVENTION

According to the present invention, a method is provided for mounting a component on a substrate by: applying a conductive adhesive on a contact pad joined to a substrate; aligning a component with the substrate such that at least one lead of the component is juxtaposed with the conductive adhesive; performing a partial cure of the conductive adhesive, such that an electrical and mechanical connection suitable for testing is formed; testing performance of the component; and performing a full cure of the conductive adhesive, such that a permanent connection is formed. The method may include additional steps, for example, applying a tacky film to the substrate and juxtaposing the component with the tacky film. Also, for example, when the testing shows a defective or misaligned component, the component may be adjusted in its position or replaced or repositioned by cold separation of at least one component lead from the partially cured conductive adhesive. Further, additional conductive adhesive may be applied, when needed, before replacement or repositioning of a component.

A composition is also provided for mounting a component on a substrate including a conductive adhesive applied on a contact pad, the conductive adhesive being partially cured, wherein the composition allows cold separation of the component from the substrate and may selectively be fully cured to permanently mount the component. By way of example, the conductive adhesive may also be partially cured and/or fully cured by heat exposure.

An apparatus is also provided including a component, a substrate, and a means for temporarily mounting and electrically connecting the component on the substrate. In one example, the temporary mounting means may also be a means for selectively mounting the component permanently on the substrate. A partially cured conductive adhesive is one example of both a temporary mounting means and a selectively permanent mounting means. Tacky film may also be used in combination with the conductive adhesive.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

According to a preferred embodiment of the present invention, a method is provided for mounting a component on a substrate by applying a conductive adhesive on a contact pad joined to a substrate, aligning a component with the substrate such that at least one lead of the component is juxtaposed with the conductive adhesive, performing a partial cure of the conductive adhesive, testing performance of the component, and performing a full cure of the conductive adhesive. In another preferred embodiment, the method includes the additional steps of applying a tacky film to the substrate and juxtaposing the component with the tacky film. Preferably, when the testing in either embodiment shows a defective or misaligned component, the component is replaced or repositioned by cold separation of the at least one component lead from the partially cured conductive adhesive. Most preferably, additional conductive adhesive is applied, when needed, before replacement or repositioning of a component.

According to a preferred embodiment of the present invention, a composition is also provided for mounting a component on a substrate including a conductive adhesive applied on a contact pad, the conductive adhesive being partially cured, wherein the composition allows cold separation of the component from the substrate and may selectively be fully cured to permanently mount the component. Preferably, the conductive adhesive may also be partially cured and/or fully cured by heat exposure.

According to a preferred embodiment of the present invention, an apparatus is also provided including a component, a substrate, and a means for temporarily mounting and electrically connecting the component on the substrate. Preferably, the temporary mounting means may also be a means for selectively mounting the component permanently on the substrate. Most preferably, a partially cured conductive adhesive is the temporary mounting means and selectively permanent mounting means. In another preferred embodiment, tacky film is used in combination with the conductive adhesive.

Figure 1:
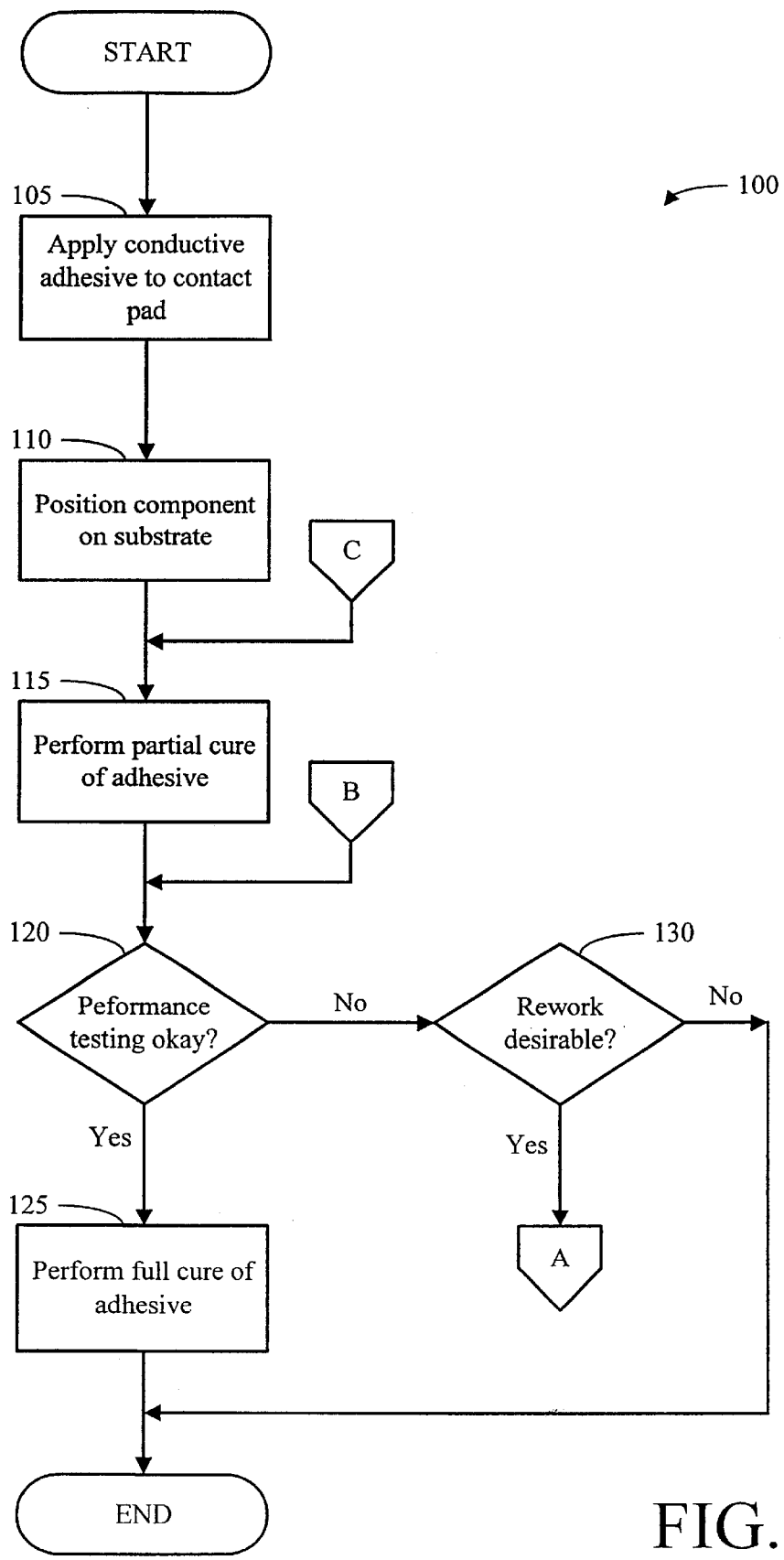
FIG. 1 is flow diagram showing a method according to the present invention.
Figure 2:
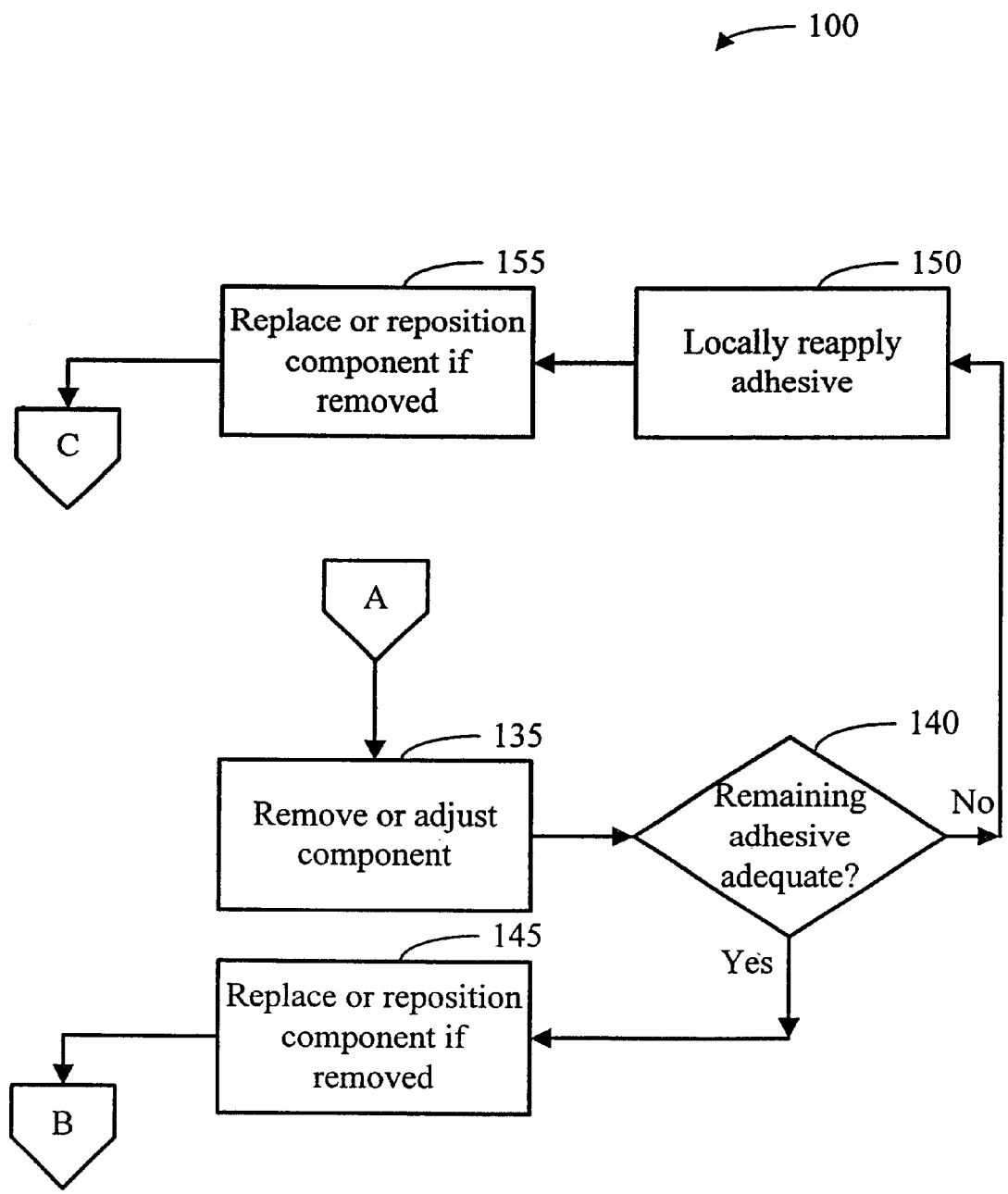
FIG. 2 is a continuation of the flow diagram in FIG. 1.

Referring to FIGS. 1 and 2, the flow diagram displays a method 100 for mounting a component on a substrate. Method 100 includes step 105 of applying a conductive adhesive on a contact pad joined to a substrate. Any method of applying conductive adhesive known to those skilled in the art is suitable, however, screen printing is preferred. Contact pads of various configurations are typically provided on substrates for forming electrical, and often mechanical, connections to components. For example, an array of contact pads may be provided for a component having for its leads an array of conductive bumps. Also, contact pads may be provided to surround the perimeter of a component having peripheral leads. Other configurations of contact pads may also be provided. The substrate may be of almost any type, but preferably is a circuit board, particularly a printed circuit board. Also, although step 105 and the discussion below describe applying conductive adhesive on a contact pad, it is also understood that the adhesive may alternatively be applied to component leads. The characteristics of a suitable conductive adhesive and a few exemplary adhesives are described below.

Step 110 includes positioning a component on the substrate by aligning a component with the substrate such that at least one lead of the component is juxtaposed with the conductive adhesive. The component may be of almost any type, including those presently mounted on substrates with the use of solder, adhesives, tape, etc. The leads of the component are the conductive devices typically used to electrically connect the component to the substrate. In the present invention, the leads also mechanically connect the component to the substrate, in particular, to the contact pads, although other devices may be provided that also mechanically connect the component to the substrate.

For example, another preferred embodiment of method 100 includes an additional step (not shown) of applying a tacky film to the substrate and juxtaposing the component with the tacky film. The tacky film could alternatively be applied to the component. The tacky film increases the strength of the mechanical connection, otherwise provided by the conductive adhesive applied in step 105, but should still allow replacement or repositioning of the component when necessary. Any method of applying tacky film known to those skilled in the art is suitable and will depend upon the type of tacky film used. The tacky film is preferably pressure sensitive tape, including tapes with silicon or acrylic-based adhesive. Some types of tacky film may also be preformed, wherein they are cut and/or stamped to have a predetermined two-dimensional or three-dimensional shape so that they may be easily applied to the appropriate surface.

One example of a suitable acrylic-based adhesive tape is SCOTCH brand 467MP or 468MP Roll Laminating Adhesive available from 3M Corp. in Minneapolis, Minn. Alternatively, the tacky film may be other materials, such as a layer of silicon or acrylic-based adhesive applied directly to the substrate, for example by screen printing. A few examples of other suitable adhesives are the partially curable nonconductive polymer resin coatings of U.S. Pat. No. 3,955,024 entitled "PRINTED CIRCUIT BOARD" to Goldman et al. issued on May 4, 1976 which is hereby incorporated by reference for its pertinent and supportive teachings. Thermoset materials may be used for the tacky film, wherein application of heat forms the mechanical connection between the component and the substrate. However, it should be remembered that the mechanical connection should be temporary, allowing replacement or repositioning of the component when necessary. Thermoplastic materials may also be used, wherein application of heat allows replacement or repositioning of the component. Caution should be exercised with using thermoplastic materials, since the heat required for removal should be less than the heat required for removal of solder-connected components.

Generally, it is preferable that the tacky film be nonconductive to prevent electrical shorts between contact pads or between component leads that the film might touch. However, if there is little possibility of electrical shorts, then conductive tacky film could be used, even though not necessary. The purpose of the tacky film is simply to provide additional strength to the mechanical connection between the component and substrate. Application of the tacky film may be useful only for limited types of components. For example, tacky film may be easily applied to form a mechanical connection between a substrate and a component with peripheral leads. However, it may be difficult to apply tacky film to the substrate or component when array connections are used.

Next in FIG. 1, step 115 includes performing a partial cure of the applied adhesive. Partially curing the conductive adhesive allows for reworking without heat, yet forms a temporary electrical and mechanical connection suitable for testing that may be selectively transformed into a permanent connection. Preferably the conductive adhesive is partially cured by heat exposure, although, it is conceivable that other curing mechanisms could be provided. For example, the partial cure could be completed by radiation exposure, such as visible light illumination, or chemical exposure, such as catalysts or gases that partially cure the conductive adhesive. It is even conceivable that the applied adhesive partially cures at ambient conditions without special processing and later processing completes the full cure described below. Accordingly, the nature of any partial cure will depend primarily on the composition of the conductive adhesive used since multiple compositions presently available or to be developed later may be suitable. Exemplary compositions and their corresponding processing conditions for a partial cure are described below.

In step 120, the electronic package assembled from the component and substrate is performance tested. Testing may include any testing techniques known to those skilled in the art or later developed. It is likely that individual components and circuit boards were tested for manufacturing defects soon after their fabrication before the start of method 100. Accordingly, the basic objective of testing in step 120 is primarily to detect system level problems and connection defects. System level problems are primarily problems only apparent when certain components and the substrate operate together in their respective systems. Connection defects are primarily from misalignment or inadequate attachment of components with contact pads. Nevertheless, testing in step 120 may also be used to identify defects in individual components or substrates incurred after fabrication, such as from mishandling, or other defects not identified in previous testing.

If the electronic package passes the performance testing of step 120, then step 125 is executed to perform a full cure of the conductive adhesive. The full cure is similar to the partial cure in that its process conditions depend primarily upon the composition used and examples are described below. However, the objectives of the full cure are different. For example, one objective is to complete the formation of an electrical and mechanical connection between the component and substrate, rendering the connection permanent. That is, once the conductive adhesive is fully cured, the connection generally cannot be altered except, perhaps, by the application of heat as with soldered components.

If the electronic package does NOT pass the performance testing of step 120, then rework processing preferably occurs, although a manufacturer may opt not to rework as shown in step 130. The option exists in method 100 for no rework to occur when circumstances dictate that as the preferred option. FIG. 2 displays the preferred steps 135 through 155 of method 100 for a rework process. Alternatively, a rework process need not include all of steps 135 through 155, but instead may only include only steps 135 and 145. In step 135 the component is removed or adjusted in position as allowed by virtue of the partial cure in step 115. This is possible, as described above, because partial curing forms a temporary electrical and mechanical connection having sufficient strength and conductive properties. Specifically, the position of the component on the substrate does not change when the substrate is moved during testing, yet, the connection is conductive and the component may be selectively removed or adjusted in position when needed. In conventional processes, a soldering iron, hot gas tools, other heated tools, or additional process steps are generally required to remove or adjust the component. However, according to the present invention, no such tools or additional steps are required, rather the removal or adjustment occurs simply by grasping the component and pulling it off the substrate or adjusting its position, respectively.

Once the component is removed or adjusted in position, the remaining adhesive is checked in step 140 to ensure that it is adequate, since portions of the adhesive may be dislodged or compromised during the removal or adjustment step 135. If the remaining adhesive is adequate, then a removed component may be replaced with a new component or the removed component repositioned as shown in step 145. If the component was only adjusted in position and not fully removed, then step 145 is not necessary. Next, method 100 resumes with performance testing in step 120 of the reworked electronic package. Although not shown, an alternative method is also conceivable wherein the method resumes after step 145 with full cure of the adhesive in step 125 without repeating performance testing in step 120.

If the remaining adhesive is not found adequate in step 140, then additional conductive adhesive may be locally applied as in step 150 prior to replacement or repositioning in step 155. Any method of reapplying conductive adhesive known to those skilled in the art is suitable, however, screen printing is preferred. When reapplication of adhesive occurs in step 150, method 100 preferably resumes with step 115 of performing a partial cure. Although not shown, alternative methods are also conceivable wherein the method resumes with performance testing in step 120 or full cure of the adhesive in step 125, skipping the partial cure or performance testing, respectively. Accordingly, the present invention provides a method for forming durable connections between a variety of components and substrates, wherein the connections do not require heat for reworking.

Figure 3:
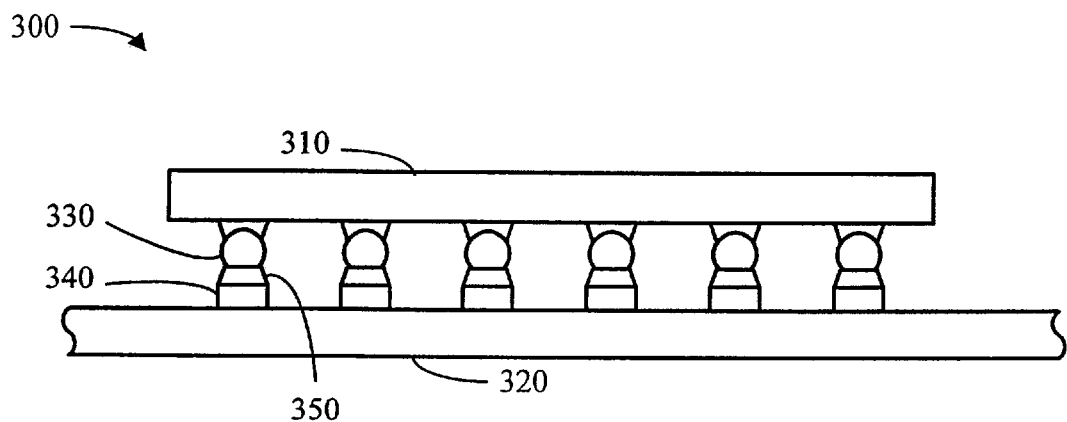
FIG. 3 is a partial side view of an electronic package with a component having array connections that are mounted to a circuit board according to a preferred embodiment of the present invention.

Referring to FIG. 3, the side view displays part of an electronic package 300 including a component 310 and a substrate 320. Component 310 has leads 330 arranged in an array and substrate 320 has contact pads 340 arranged in a corresponding array to match up with array leads 330. Leads 330 are temporarily joined to corresponding contact pads 340 by a partially cured conductive adhesive 350. Partially cured conductive adhesive 350 allows for reworking of package 300 without heat, yet forms an electrical and mechanical connection suitable for testing that may be selectively transformed into a permanent connection. That is, a connection suitable to allow placing electronic package 300 in service. Exemplary components suitable for the preferred embodiment shown in FIG. 3 include a ball-grid array (BGA), flip-chip, and other components with array-type connections.

Figure 4:
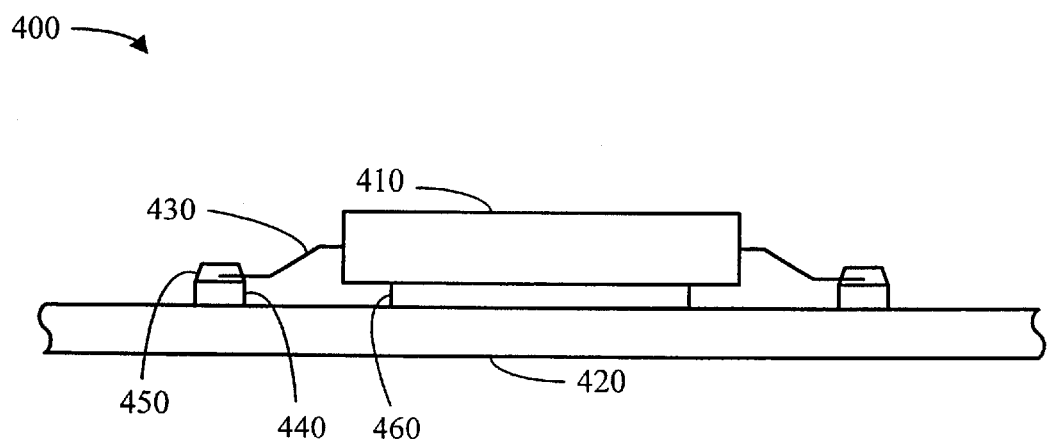
FIG. 4 is a partial side view of an electronic package with a component having peripheral leads that are mounted to a circuit board according to a preferred embodiment of the present invention.

Referring to FIG. 4, the side view displays part of an electronic package 400 including a component 410 and a substrate 420. Component 410 has peripheral leads 430 and substrate 420 has contact pads 440 arranged in a corresponding pattern about the perimeter of component 410 to match up with peripheral leads 430. Leads 430 are temporarily joined to corresponding contact pads 440 by a partially cured conductive adhesive 450. Partially cured conductive adhesive 450 allows for reworking of package 400 without heat, yet forms an electrical and mechanical connection suitable for testing that may be selectively transformed into a permanent connection. FIG. 4 also displays tacky film 460 positioned between component 410 and substrate 420 as described in method 100 above. Exemplary components suitable for the preferred embodiment shown in FIG. 4 include a quad flat package (QFP), J-lead components, components suitable for tape automated bonding (TAB), and other components with peripheral-type connections.

The present invention also provides a composition for mounting component 310 or 410 on substrate 320 or 420, the composition including partially cured conductive adhesive 350 or 450 applied on contact pad 340 or 440, wherein the composition allows rework as described in method 100 above and may selectively be fully cured to permanently mount component 310 or 410. Preferably, conductive adhesive 350 or 450 is fully cured by heat exposure, and most preferably, it is also partially cured by heat exposure. Examples of specific compositions and curing processes are described below.

EXAMPLE 1

EPO-TEK E2101 and EPO-TEK H20E-PFC (two-component silver filled epoxies available from Epoxy Technology, Inc. in Billerica, Mass.) may be used in the method, apparatus, and composition described above. Partial curing of the epoxies is performed at a bond line temperature of 70° C. (Celsius)±5° C. for 30 min (minutes)±5 min. Full curing of E2101 is performed at a bond line temperature of 175° C. for 15 min or 150° C. for 60 min. Full curing of H20E-PFC is performed at a minimum bond line temperature of 175° C. for 45 sec (seconds), 150° C. for 5 min, 120° C. for 15 min, 80° C. for 90 min, or 50° C. for 12 hours. Full curing may also be otherwise according to the manufacturer's specifications.

EXAMPLE 2

EPO-TEK E3114-PFC and EPO-TEK E3116 (one-component silver filled epoxies available from Epoxy Technology, Inc. in Billerica, Mass.) may be used in the method, apparatus, and composition described above. Partial curing of the epoxies is performed at a bond line temperature of 100° C.±5° C. for 20 min±5 min. Full curing of E3114-PFC is performed at a minimum bond line temperature of 200° C. for 30 sec, 175° C. for 45 sec, 160° C. for 5 min, or 150° C. for 15 min. Full curing of E3116 is performed at a minimum bond line temperature of 200° C. for 15 sec, 175° C. for 45 sec, 160° C. for 5 min, or 150° C. for 15 min. Full curing may also be otherwise according to the manufacturer's specifications.

EXAMPLE 3

The conductive adhesive of U.S. Pat. No. 5,372,750 entitled "ELECTRICALLY CONDUCTIVE SCREEN PRINTABLE COMPOSITION AND METHOD OF MAKING SAME" to Toma issued on Dec. 13, 1994 may also be partially cured according to the present invention.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions or positions of the apparatus indicated in the drawings or herein are given as an example of possible dimensions and positions and not as a limitation. Similarly, unless otherwise specified, any sequence of steps of the method indicated in the drawings or herein are given as an example of a possible sequence and not as a limitation. For example, it will be understood that, while various of the conductors (connections) are shown in the drawing as single lines, they are not so shown in a limiting sense, and may comprise plural conductor (connections), as is understood in the art.

What is claimed is:

1. A system, comprising:
   a substrate having an electrically conductive pad therein;
   an uncured electrically conductive adhesive layer on the pad, wherein the adhesive layer includes an uncured electrically conductive adhesive, and wherein the adhesive layer is in mechanical and electrical contact with the pad;
   a component coupled to the substrate, wherein the component comprises a lead that is in mechanical and electrical contact with the adhesive layer so as to form an electrical connection between the component and the pad, and wherein the adhesive layer is not in mechanical contact with the component; and
   partial curing means for partially curing the adhesive layer throughout the adhesive layer while the adhesive layer is on the pad and is not in mechanical contact with the component, wherein the component is coupled to the substrate by an interfacing electrically non-conductive tacky film that is in mechanical contact with both the component and the substrate.

2. The system of claim 1, wherein the tacky film includes pressure sensitive tape.

3. The system of claim 1, wherein the adhesive includes pressure silver-filled epoxy.

4. The system of claim 1, wherein the partial curing means includes heating means.

5. The system of claim 1, wherein the partial curing means includes radiation means.

6. The system of claim 1, wherein the partial curing means includes chemical means.

7. The system of claim 1, wherein the partial curing means forms a temporary mechanical bond between the pad and the lead.

8. The system of claim 1, wherein the substrate comprises a circuit board.

9. The system of claim 1, wherein the components is selected from the group consisting of a ball-grid array (BGA) device, a flip-chip, components with array-type connections, a quad flat package (QFP), components suitable for tape automated bonding (TAB), and components with peripheral-type connections.

10. The system of claim 1, further comprising:
  testing means for testing the component and determining whether the component is defective or misaligned;
  replacing means for replacing the component, if defective, with a new component and adjusting the position of or repositioning the component if misaligned; and
  full curing means for fully curing the adhesive layer throughout the adhesive layer, said fully curing providing permanent fixed mechanical and electrical connections between the pad and the lead.

11. A system comprising:
  a substrate having an electrically conductive pad thereon;
  an partially cured electrically conductive adhesive layer on the pad, wherein the adhesive layer includes a partially cured electrically conductive adhesive, and wherein the adhesive layer is in mechanical and electrical contact with the pad; and
  a component coupled to the substrate by an interfacing electrically non-conductive tacky film that is in mechanical contact with both the component and the substrate, wherein the component comprises a lead that is in mechanical and electrical contact with the adhesive layer so as to form an electrical connection between the component and the pad, and wherein the adhesive layer is not in mechanical contact with the component.

12. The system of claim 11, wherein the tacky film includes pressure sensitive tape.

13. The system of claim 11, wherein the adhesive includes silver-filled epoxy.

14. The system of claim 11, wherein a temporary mechanical bond exists between the pad and the lead.

15. The system of claim 11, wherein the substrate comprises a circuit board.

16. The system of claim 11, wherein the component is selected from the group consisting of a ball-grid array (BGA) device, a flip-chip, component with array-type connections, a quad flat package (QFP), components suitable for tape automated bonding (TAB), and components with peripheral-type connections.

* * * * *